US012642045B2

(12) United States Patent
Lee et al.

(10) Patent No.: US 12,642,045 B2
(45) Date of Patent: May 26, 2026

(54) SEMICONDUCTOR POST-PROCESS IMPACT DETECTION DEVICE, SEMICONDUCTOR POST-PROCESS TRANSPORTATION SYSTEM INCLUDING SAME, AND IMPACT LOCATION TRACKING METHOD USING SAME

(71) Applicant: SAMSUNG ELECTRONICS CO., LTD., Suwon-Si (KR)

(72) Inventors: Taemin Lee, Pohang-si (KR); Dongsoo Lee, Suwon-si (KR); Jooyoung Yoon, Suwon-si (KR); Sangsoon Lim, Pohang-si (KR); Anhi Pyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 18/368,116

(22) Filed: Sep. 14, 2023

(65) Prior Publication Data

US 2024/0304476 A1 Sep. 12, 2024

(30) Foreign Application Priority Data

Mar. 10, 2023 (KR) ........................ 10-2023-0032097

(51) Int. Cl.
*H10P 72/00* (2026.01)
*G01C 19/00* (2013.01)
(Continued)

(52) U.S. Cl.
CPC ........ *H10P 72/0608* (2026.01); *G01C 19/005* (2022.01); *G01P 1/07* (2013.01);
(Continued)

(58) Field of Classification Search
CPC ...... G01P 15/0891; G01P 15/18; G01P 15/14; H01L 21/67288; H01L 21/67253;
(Continued)

(56) References Cited

U.S. PATENT DOCUMENTS

| | | | |
|---|---|---|---|
| 7,778,793 B2 | 8/2010 | Bonciolini et al. | |
| 10,424,497 B2 | 9/2019 | Kim et al. | |

(Continued)

FOREIGN PATENT DOCUMENTS

| | | |
|---|---|---|
| CN | 109637946 | 4/2019 |
| CN | 111863681 | 10/2020 |

(Continued)

*Primary Examiner* — Helen C Kwok
(74) *Attorney, Agent, or Firm* — Morgan, Lewis & Bockius LLP

(57) ABSTRACT

A semiconductor post-process impact detection device includes a detection body that moves along a distribution line. A vibration detection unit is coupled to the detection body. The vibration detection unit detects vibration of the detection body. A rotation detection unit is coupled to the detection body. The rotation detection unit detects rotation of the detection body. An internal power supply is coupled to the detection body. A controller processes signals of the vibration detection unit and the rotation detection unit to determine information concerning the detection body. The controller transmits the information concerning the detection body to a data transmission unit. The data transmission unit transmits the information concerning the detection body provided from the controller to a data display unit. The data display unit displays the information concerning the detection body provided from the data transmission unit.

18 Claims, 11 Drawing Sheets

(51) Int. Cl.

| | |
|---|---|
| *G01P 1/07* | (2006.01) |
| *G01P 3/00* | (2006.01) |
| *G01P 15/08* | (2006.01) |
| *G01P 15/14* | (2013.01) |
| *G01P 15/18* | (2013.01) |
| *H10P 72/10* | (2026.01) |
| *H10P 72/30* | (2026.01) |

(52) U.S. Cl.

CPC ............ *G01P 3/00* (2013.01); *G01P 15/0891* (2013.01); *G01P 15/14* (2013.01); *G01P 15/18* (2013.01); *H10P 72/0604* (2026.01); *H10P 72/0616* (2026.01); *H10P 72/0618* (2026.01); *H10P 72/16* (2026.01); *H10P 72/3212* (2026.01); *H10P 72/3218* (2026.01)

(58) Field of Classification Search

CPC ......... H01L 21/67294; H01L 21/67333; H01L 21/67721; H01L 21/6733; H01L 21/67265; H10P 72/0616; H10P 72/0604; H10P 72/0618; H10P 72/3212; H10P 72/0608; H10P 72/3218; H01P 72/16

See application file for complete search history.

(56) References Cited

U.S. PATENT DOCUMENTS

| | | | | |
|---|---|---|---|---|
| 10,509,052 | B2 | 12/2019 | Thaulad et al. | |
| 10,790,176 | B2 | 9/2020 | Bae et al. | |
| 2005/0080566 | A1* | 4/2005 | Vock | A63B 24/00 |
| | | | | 702/5 |
| 2008/0228430 | A1* | 9/2008 | Bonciolini | G01P 15/18 |
| | | | | 702/141 |
| 2017/0268941 | A1* | 9/2017 | Finlay | H01L 21/67253 |
| 2021/0407826 | A1* | 12/2021 | Huang | H01L 21/67775 |
| 2022/0165598 | A1 | 5/2022 | Cho et al. | |
| 2023/0035556 | A1* | 2/2023 | Chang | H01L 21/67724 |

FOREIGN PATENT DOCUMENTS

| | | | | |
|---|---|---|---|---|
| JP | 4702693 | 6/2011 | | |
| KR | 10-2018-0091714 | 8/2018 | | |
| KR | 20190076100 A | * | 7/2019 | ............. H01L 22/30 |
| KR | 10-2022-0070980 | 5/2022 | | |

* cited by examiner

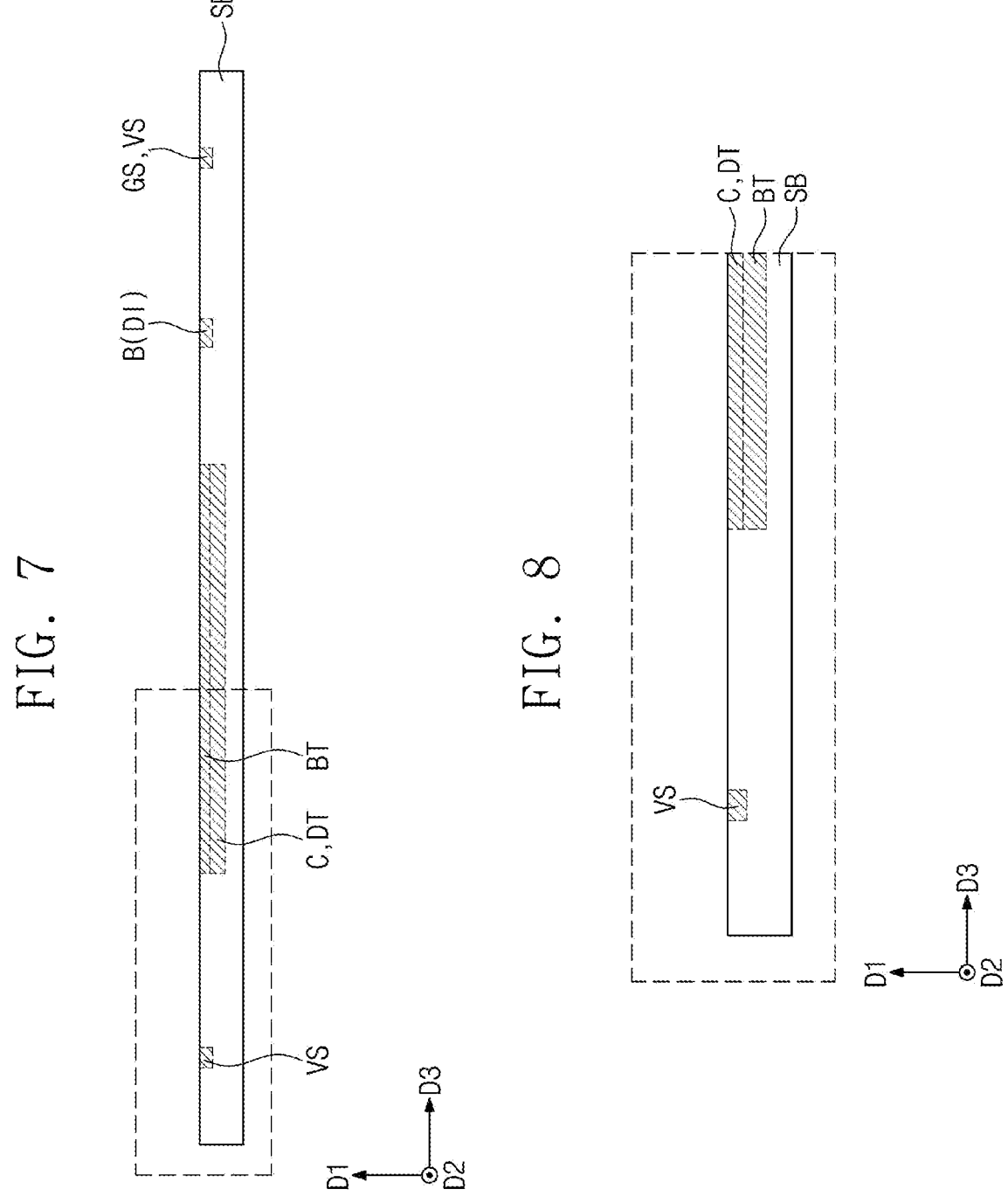

SEMICONDUCTOR POST-PROCESS IMPACT DETECTION DEVICE, SEMICONDUCTOR POST-PROCESS TRANSPORTATION SYSTEM INCLUDING SAME, AND IMPACT LOCATION TRACKING METHOD USING SAME

CROSS-REFERENCE TO RELATED APPLICATION

This application claims priority under 35 U.S.C. § 119 to Korean Patent Application No. 10-2023-0032097, filed on Mar. 10, 2023 in the Korean Intellectual Property Office, the disclosure of which is incorporated by reference in its entirety herein.

1. TECHNICAL FIELD

Embodiments of the present disclosure described herein relate to a semiconductor post-process impact detection device, a semiconductor post-process transportation system including the same, and an impact location tracking method using the same, and more particularly, to a semiconductor post-process impact detection device and a semiconductor post-process transportation system which may display information on an impact when the impact occurs.

2. DISCUSSION OF RELATED ART

A semiconductor manufacturing process may include a plurality of separate processes that are performed. For example, the semiconductor manufacturing process may be divided into a pre-process of engraving a circuit on a wafer and a post-process of packaging a chip. In the post-process, elements need to be moved from one machine to another machine for performance of difference processes thereon. To this end, a magazine M/Z for transporting a printed circuit board (PCB) and a custom tray for transporting a device may be used.

SUMMARY

Embodiments of the present disclosure provide a semiconductor post-process impact detection device, a semiconductor post-process transportation system including the same, and an impact location tracking method using the same, which may measure an impact acceleration of a transportation device used in a semiconductor post-process.

Embodiments of the present disclosure provide a semiconductor post-process impact detection device, a semiconductor post-process transportation system including the same, and an impact location tracking method using the same, which may measure a rotating angular velocity of the transportation device used in the semiconductor post-process.

Embodiments of the present disclosure provide a semiconductor post-process impact detection device, a semiconductor post-process transportation system including the same, and an impact location tracking method using the same, which, when the impact acceleration or the rotating angular velocity of the transportation device used in the semiconductor post-process is greater than or equal to a threshold impact acceleration or a threshold rotating angular velocity, displays this state to an external unit, such as a data display unit.

Embodiments of the present disclosure provide a semiconductor post-process impact detection device, a semiconductor post-process transportation system including the same, and an impact location tracking method using the same, which may track a location of the transportation device used in the semiconductor post-process.

Embodiments of the present disclosure provide a semiconductor post-process impact detection device, a semiconductor post-process transportation system including the same, and an impact location tracking method using the same, which may track a distribution line section having a high distribution deviation probability.

The aspects of embodiments of the present disclosure are not limited to the aspects described above, and those skilled in the art will clearly understand other aspects not described from the following description.

According to an embodiment of the present disclosure, a semiconductor post-process impact detection device includes a detection body that moves along a distribution line. A vibration detection unit is coupled to the detection body. The vibration detection unit detects vibration of the detection body. A rotation detection unit is coupled to the detection body. The rotation detection unit detects rotation of the detection body. An internal power supply is coupled to the detection body. A controller processes signals of the vibration detection unit and the rotation detection unit to determine information concerning the detection body. The controller transmits the information concerning the detection body to a data transmission unit. The data transmission unit transmits the information concerning the detection body provided from the controller to a data display unit. The data display unit displays the information concerning the detection body provided from the data transmission unit.

According to an embodiment of the present disclosure, a semiconductor post-process transportation system includes a distribution line. A transportation device moves along the distribution line and transports a substrate. An impact detection device moves along the distribution line. The impact detection device includes a detection body that moves along the distribution line. A vibration detection unit is coupled to the detection body. The vibration detection unit detects vibration of the detection body. A rotation detection unit is coupled to the detection body. The rotation detection unit detects rotation of the detection body. An internal power supply is coupled to the detection body. A controller processes signals of the vibration detection unit and the rotation detection unit.

According to an embodiment of the present disclosure, an impact location tracking method includes measuring a rotating angular velocity by a rotation detection unit of an impact detection device on a semiconductor post-process distribution line. A rotation direction is determined when the rotating angular velocity is greater than or equal to a threshold rotating angular velocity stored in a controller of the impact detection device. The impact detection device includes a detection body. A rotation detection unit is coupled to the detection body. The rotation detection unit detects rotation of the detection body. An internal power supply is coupled to the detection body. The controller processes a signal of the rotation detection unit to determine information concerning the detection body. The controller transmits the information concerning the detection body to a data transmission unit. The data transmission unit transmits the information concerning the detection body provided from the controller to a data display unit. The determining of the rotation direction of the impact detection device includes measuring direction change information of a node of a distribution map. The direction change information of the node and the rotating angular velocity of the impact detection device are matched with each other.

The specific details of other embodiments of the present disclosure are included in the detailed description and the drawings.

BRIEF DESCRIPTION OF THE DRAWINGS

The above and other objects and features of the present disclosure will become apparent by describing in detail non-limiting embodiments thereof with reference to the accompanying drawings.

FIG. 7 is a front view illustrating the custom tray according to an embodiment of the present disclosure.

FIG. 8 is an enlarged front view illustrating a portion of the custom tray according to an embodiment of the present disclosure.

FIG. 10 is a front view illustrating a distribution line and the semiconductor package transportation magazine according to an embodiment of the present disclosure.

FIG. 11 is a plan view illustrating the distribution line and the custom tray according to an embodiment of the present disclosure.

DETAILED DESCRIPTION OF EMBODIMENTS

Figure 1:
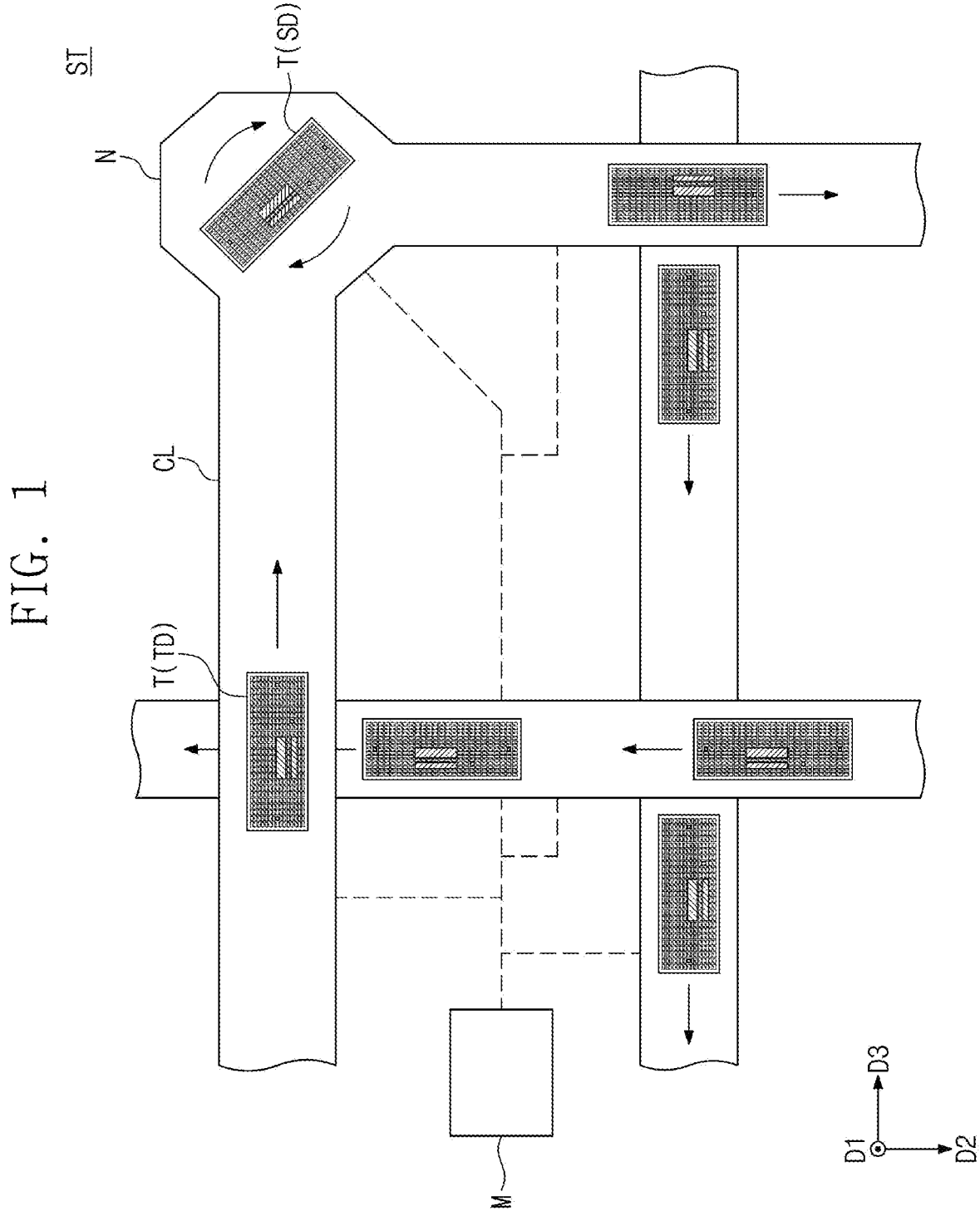
FIG. 1 is a plan view illustrating a semiconductor post-process transportation system according to an embodiment of the present disclosure.

Hereinafter, embodiments of the present disclosure will be described in detail with reference to the accompanying drawings. Throughout the specification, the same reference numeral may refer to the same component.

Hereinafter, D1 may refer to a first direction, D2 intersecting the first direction D1 may refer to a second direction, and D3 intersecting the first direction D1 and the second direction D2 may refer to a third direction D3. The first direction D1 may refer to an upward direction, and an opposite direction to the first direction D1 may refer to a downward direction. Further, the second direction D2 and the third direction D3 may refer to horizontal directions. In an embodiment, the first to third directions D1 to D3 may be orthogonal with each other. However, embodiments of the present disclosure are not necessarily limited thereto.

FIG. 1 is a plan view illustrating a semiconductor post-process transportation system ST according to an embodiment of the present disclosure.

Referring to FIG. 1, the semiconductor post-process transportation system ST may be provided. In an embodiment, the semiconductor post-process transportation system ST may include a distribution line CL, a semiconductor post-process impact detection device SD, a transportation device TD, a node N, a distribution map M, and the like.

In an embodiment, the distribution line CL may transport the semiconductor post-process impact detection device SD (hereinafter, referred to as the impact detection device SD) and the transportation device TD. In an embodiment, the distribution line CL may be a conveyor line. For example, in an embodiment the distribution line CL may be an overhead hoist transfer OHT. The conveyor line may be in the form of a belt conveyor, a chain conveyor, or the like. In an embodiment, the OHT may move an object along a rail installed on a factory ceiling. However, embodiments of the present disclosure are not necessarily limited thereto. The OHT may move itself between various process apparatuses without intervention of a person. The impact detection device SD may be positioned on the distribution line CL. In an embodiment, the transportation device TD may be in the form of a custom tray T and/or a semiconductor package transportation magazine MZ. The transportation device TD may include a transportation body supporting a substrate to transport the substrate for processing or after a process is performed. In an embodiment, the impact detection device SD may be in the form of the custom tray T. In an embodiment, the impact detection device SD may be in the form of the semiconductor package transportation magazine MZ. A movement direction and speed of the impact detection device SD and the transportation device TD may be adjusted according to movement of the distribution line CL. The distribution line CL may move in the horizontal direction. A vertical height difference may occur in the distribution line CL while the distribution line CL moves in the horizontal direction. When the impact detection device SD or the transportation device TD passes through a section in which the corresponding height difference occurs, an impact may occur. The distribution line CL may be arranged in various heights so that a portion or the entirety of the distribution line CL may overlap in a plan view. The term "in a plan view" used in the present specification may be a viewpoint viewed from above as illustrated in FIG. 1. The distribution line CL may be controlled by the distribution map M.

The node N may change movement directions of the impact detection device SD and the transportation device TD on the distribution line CL. In an embodiment, the node N may include a diverter, an unloader, a loader, a stocker, a handler, and the like. The diverter may change the movement directions of the impact detection device SD and the transportation device TD. For example, the diverter may move the impact detection device SD and the transportation device TD moving linearly along the distribution line CL in another direction. The unloader may carry a substrate after a specific process is performed to the transportation device TD. The loader may supply the substrate to the specific process by inserting the transportation device TD including the substrate. In an embodiment, the stocker may be an automation apparatus that is connected to a distribution automation system and implements a function of storing, inputting or outputting, or additionally moving semiconductor materials, materials, substrates, and the like. The handler may move the impact detection device SD and the transportation device TD in an up-down direction, in a left-right direction, or the like. Individual movement directions, positions, and the like of the impact detection device SD and the transportation device TD may be changed and adjusted by the node N.

In an embodiment, the distribution map M may control a speed and traveling direction of the distribution line CL, a rotation direction and rotation speed of the node N, and the like to control a traveling direction, a movement speed, or the like of the impact detection device SD or the transportation device TD. The distribution map M may identify a problem in real time and move the impact detection device SD or the transportation device TD so that necessary actions may be taken for the specific impact detection device SD or the transportation device TD. In an embodiment, the distribution map M may perform two-way communication in a wireless manner with the impact detection device SD through a data transmission unit DT (see FIG. 2). When the impact detection device SD or the transportation device TD passes through a specific position of the distribution line CL or the node N, movement information may be stored in the distribution map M.

Figure 2:
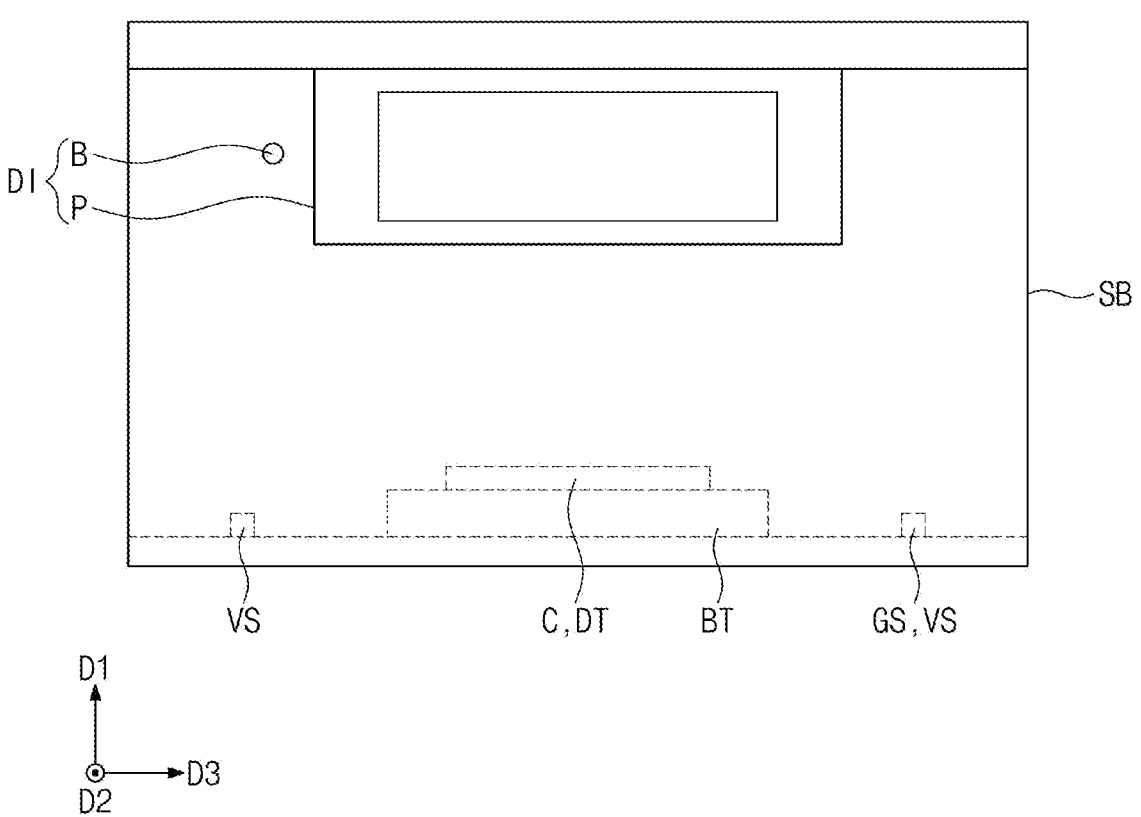
FIG. 2 is a front view illustrating a semiconductor package transportation magazine according to an embodiment of the present disclosure.
Figure 3:
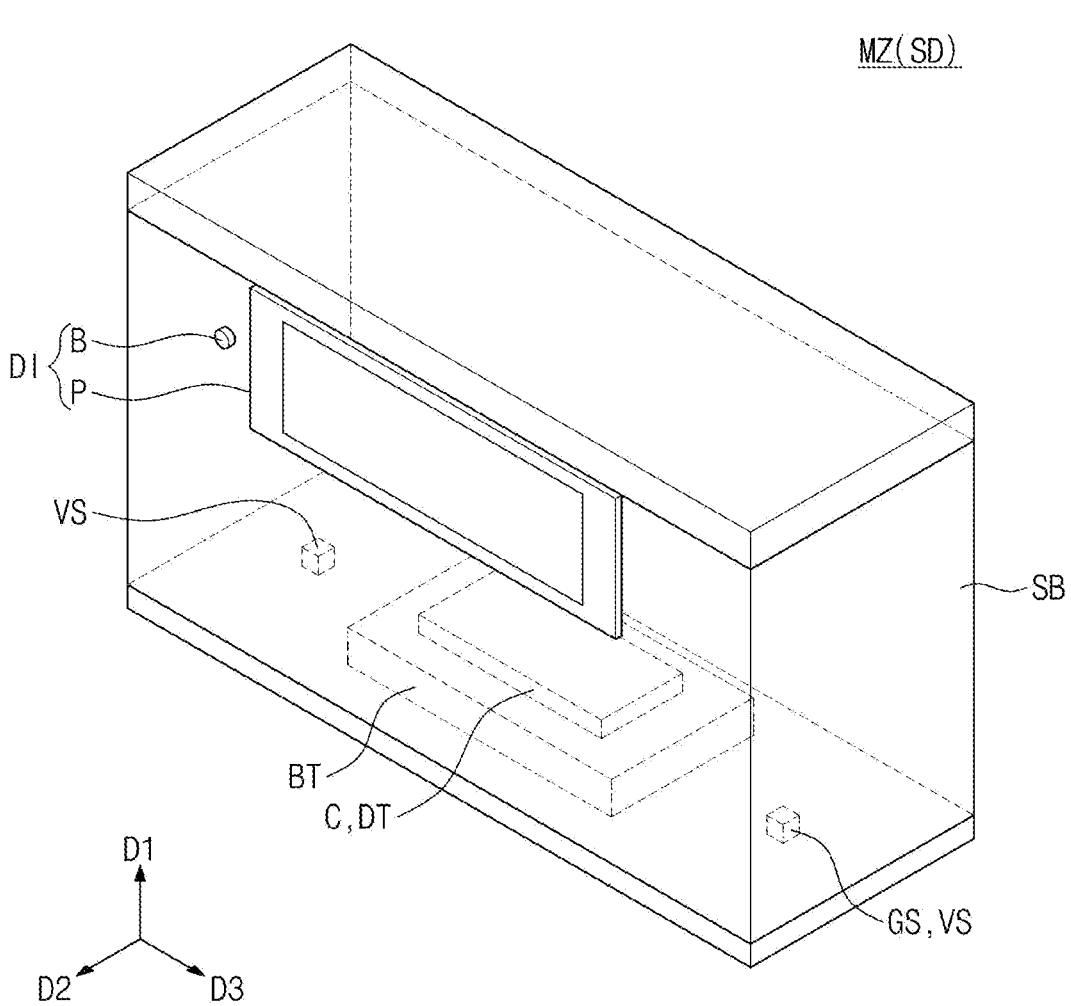
FIG. 3 is a perspective view illustrating the semiconductor package transportation magazine according to an embodiment of the present disclosure.
Figure 4:
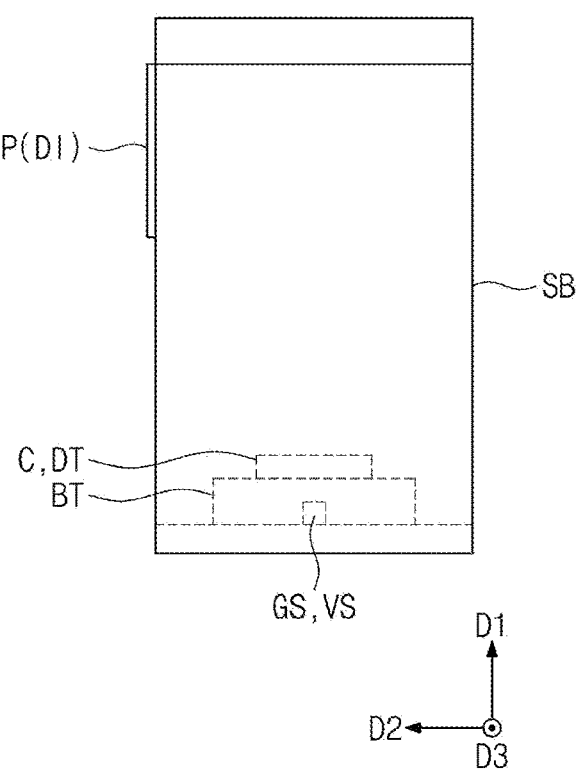
FIG. 4 is a side view illustrating the semiconductor package transportation magazine according to an embodiment of the present disclosure.

FIGS. 2, 3, and 4 are a front view, a perspective view, and a side view illustrating the semiconductor package transportation magazine MZ according to embodiments of the present disclosure.

The semiconductor package transportation magazine MZ may transport a printed circuit board (PCB). The semiconductor package transportation magazine MZ may transport several PCBs at once while the PCBs are stacked in layers. For example, in an embodiment the semiconductor package transportation magazine MZ may transport the PCB while the PCB is inserted into a long groove recessed in the horizontal direction. The semiconductor package transportation magazine MZ may be positioned on the distribution line CL. For example, the semiconductor package transportation magazine MZ may be positioned on the conveyor line. The semiconductor package transportation magazine MZ may be positioned in the OHT. In an embodiment, the impact detection device SD in the form of the semiconductor package transportation magazine MZ may include a detection body SB, a vibration detection unit VS, a rotation detection unit GS, an internal power supply BT, a controller C, the data transmission unit DT, and a data display unit DI.

Referring to FIG. 3, in an embodiment the detection body SB may have a rectangular parallelepiped shape. For example, the detection body SB may have the same shape as that of a body (e.g., the transportation body) of the semiconductor package transportation magazine MZ that is the transportation device TD. In an embodiment, the entire weight of the impact detection device SD in the form of the semiconductor package transportation magazine MZ including all of the detection body SB, the vibration detection unit VS, the rotation detection unit GS, the internal power supply BT, the controller C, the data transmission unit DT, and the data display unit DI may be the same as that of the entire weight of the transportation device TD in the form of the semiconductor package transportation magazine MZ on which the substrate is mounted. In an embodiment, the detection body SB may include a weight adjustment member that adds weight to the impact detection device SD so that the weight of the impact detection device SD may be adjusted.

Referring to FIGS. 2, 3, and 4, the vibration detection unit VS may be coupled to the detection body SB. For example, in an embodiment the vibration detection unit VS may be coupled to a lower end of the detection body SB. The vibration detection unit VS may detect vibration of the detection body SB. In an embodiment, the vibration detection unit VS may be provided as two vibration detection units VS. The two vibration detection units VS may be spaced apart from each other in a lengthwise direction of the detection body SB (e.g., the third direction D3). However, embodiments of the present disclosure are not necessarily limited thereto and the number of the vibration detection units VS and the arrangement thereof may vary. Hereinafter, for convenience, the vibration detection unit VS will be described in a singular form. In an embodiment, the vibration detection unit VS may include a three-axis accelerometer. The three-axis accelerometer may measure an impact acceleration in the horizontal direction. The three-axis accelerometer may measure an impact acceleration in a vertical direction. In an embodiment, the three-axis accelerometer may have an impact acceleration detection range of about 2 g (g is the gravitational acceleration of 9.81 m/s^2) or more in all directions. The vibration detection unit VS may transmit data to the controller C.

Referring to FIGS. 2, 3, and 4, the rotation detection unit GS may be coupled to the detection body SB. For example, in an embodiment the rotation detection unit GS may be coupled to the lower end of the detection body SB. In an embodiment, the rotation detection unit GS may include a gyro sensor. The rotation detection unit GS may detect a rotation direction, a rotating angular velocity, and the like of the detection body SB. In an embodiment, the rotation detection unit GS may be disposed together at the same position as that of one among the two vibration detection units VS. The rotation detection unit GS may transmit data to the controller C.

Referring to FIGS. 2, 3, and 4, the internal power supply BT may be coupled to the detection body SB. In an embodiment, the internal power supply BT may be a mercury battery, a manganese battery, an alkaline battery, a lithium battery, a lead acid battery, a nickel-cadmium battery, a nickel-hydrogen battery, a lithium ion battery, or the like. However, embodiments of the present disclosure are not necessarily limited thereto. In an embodiment, the internal power supply BT may be disposed at the lower part of the detection body SB. The internal power supply BT may supply power to the vibration detection unit VS, the rotation detection unit GS, the controller C, the data transmission unit DT, the data display unit DI, and the like. The internal power supply BT may supply power to the impact detection device SD so that the impact detection device SD does not need to receive power from an external power supply in a wired manner.

Referring to FIGS. 2, 3, and 4, the controller C may be coupled to the detection body SB. In an embodiment, the controller C may be a dedicated processor. For example, the controller C may be an embedded processor. The controller C may be a general purpose processor. In an embodiment, the controller C may include a central processing unit (CPU) and/or a graphic processing unit (GPU). The controller C may process signals of the vibration detection unit VS and the rotation detection unit GS. For example, the controller C may process the impact acceleration measured by the vibration detection unit VS. The controller C may process the rotating angular velocity measured by the rotation detection unit GS. The controller C may be disposed on the internal power supply BT. The controller C may transmit information concerning the detection body SB, such as the impact acceleration of the vibration detection unit VS and the rotating angular velocity of the rotation detection unit GS to the data transmission unit DT. In an embodiment, the controller C may set a threshold impact acceleration and a threshold rotating angular velocity.

Referring to FIGS. 2, 3, and 4, the data transmission unit DT may be coupled to the detection body SB. In an embodiment, the data transmission unit DT may be disposed on the same position as that of the controller C. The data transmission unit DT may transmit the information provided from the controller C to an external unit. The data transmission unit DT may transmit the information provided from the controller C to the external unit, such as the data display unit DI. The data transmission unit DT may receive the power from the internal power supply BT.

Referring to FIGS. 2, 3, and 4, the data display unit DI may be coupled to the detection body SB. The data display unit DI may receive the power from the internal power supply BT. The data display unit DI may display the information provided from the data transmission unit DT. In an embodiment, the data display unit DI may include a buzzer B and/or a display panel P.

Referring to FIGS. 2, 3, and 4, the buzzer B may be coupled to the detection body SB. In an embodiment, the buzzer B may output a sound, such as a notification sound, when the impact acceleration detected by the vibration detection unit VS is greater than or equal to the threshold impact acceleration set by the controller C. For example, the threshold impact acceleration may be a predetermined acceleration level set by the controller C. The buzzer B may output a sound, such as notification sound, when the rotating angular velocity detected by the rotation detection unit GS is greater than or equal to the threshold rotating angular velocity set by the controller C. For example, the threshold rotating angular velocity may be a predetermined angular velocity level set by the controller C.

Referring to FIGS. 2 and 3, the display panel P may be coupled to the detection body SB. In an embodiment, the display panel P may include a liquid crystal display (LCD) panel, a light emitting diode (LED) panel, an organic light emitting diode (OLED) panel, and the like. However, embodiments of the present disclosure are not necessarily limited thereto. The display panel P may receive the impact acceleration measured by the vibration detection unit VS from the data transmission unit DT and display the impact acceleration. The display panel P may receive the rotating angular velocity measured by the rotation detection unit GS from the data transmission unit DT and display the rotating angular velocity.

Figure 5:
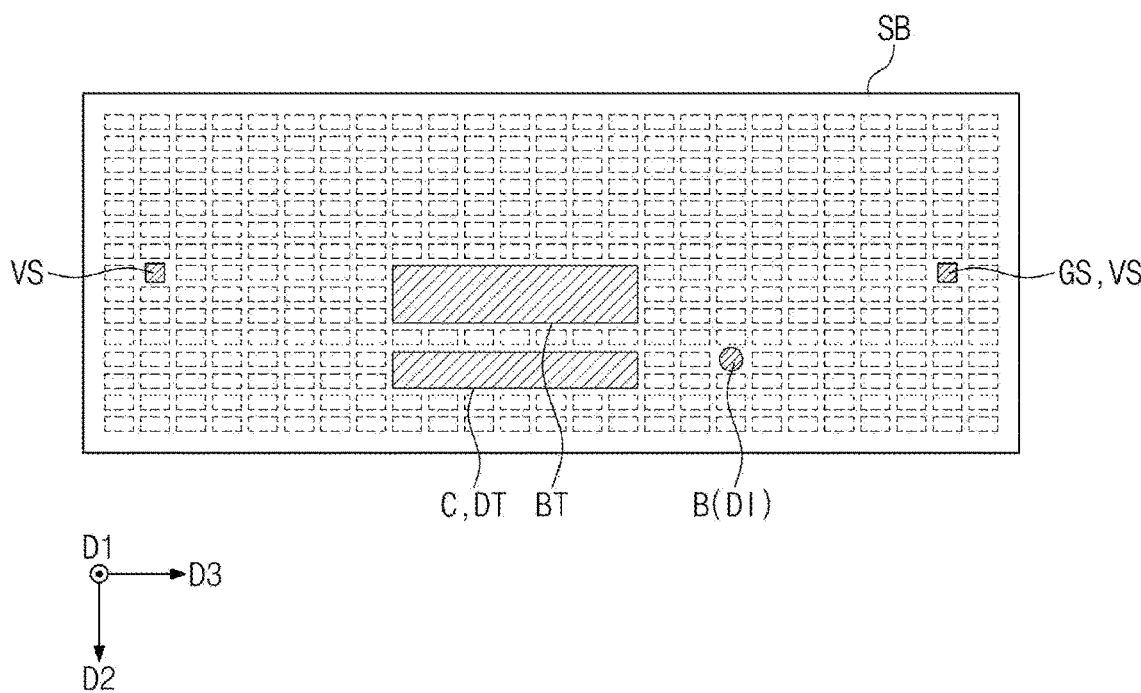
FIG. 5 is a plan view illustrating a custom tray according to an embodiment of the present disclosure.
Figure 6:
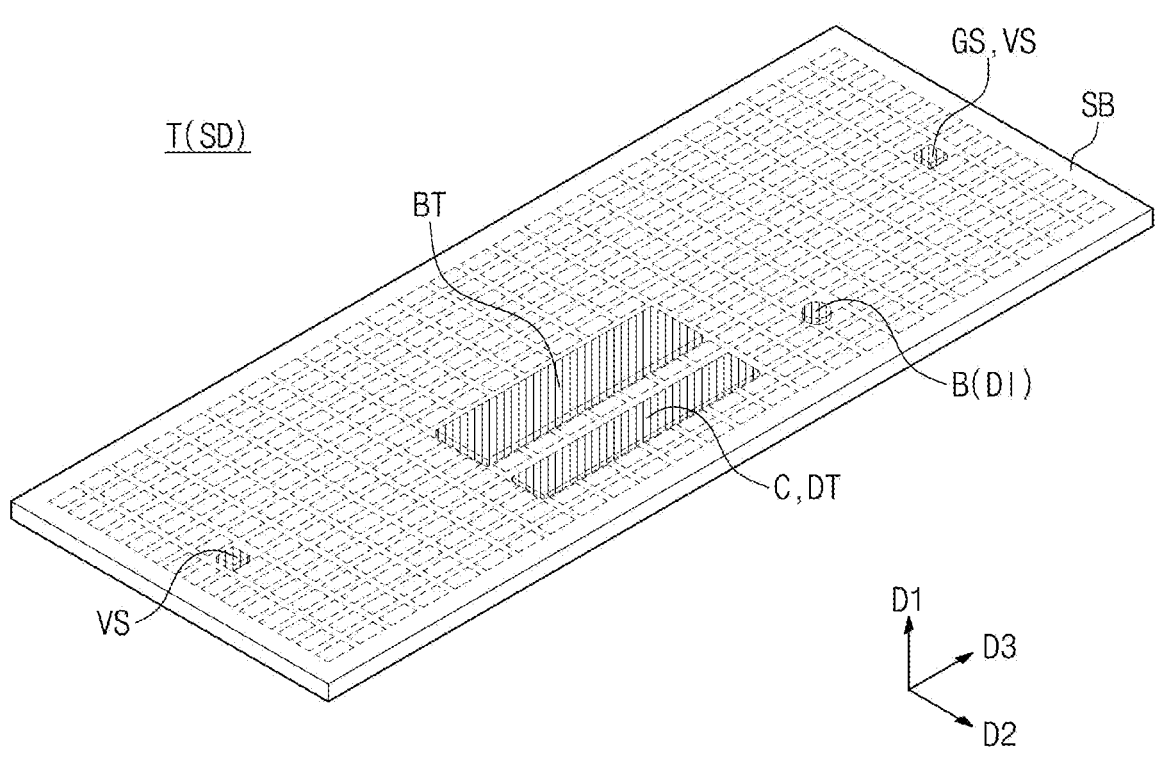
FIG. 6 is a perspective view illustrating the custom tray according to an embodiment of the present disclosure.

FIGS. 5, 6, and 7 are a plan view, a perspective view, and a front view illustrating the custom tray T according to embodiments of the present disclosure.

FIG. 8 is an enlarged front view illustrating a portion of the custom tray T according to embodiments of the present disclosure.

Referring to FIGS. 5, 6, and 7, the custom tray (C-tray) T may accommodate a plurality of packaged semiconductor chips. In an embodiment, a plurality of grooves may be arranged in an upper surface of the custom tray T to be spaced apart from each other at regular intervals. The custom tray T may be positioned on the distribution line CL. For example, the custom tray T may be positioned on the conveyor line. A traveling direction of the custom tray T may be changed by the node N. In an embodiment, the custom tray T may include the detection body SB, the data display unit DI, the vibration detection unit VS, the rotation detection unit GS, the internal power supply BT, the controller C, and the data transmission unit DT. For example, in an embodiment the data display unit DI, the vibration detection unit VS, the rotation detection unit GS, the internal power supply BT, the controller C, and the data transmission unit DT may be coupled to an inside of the detection body SB. The data display unit DI, the vibration detection unit VS, the rotation detection unit GS, the internal power supply BT, the controller C, and the data transmission unit DT may have relatively different heights from each other. However, the heights of all the data display unit DI, the vibration detection unit VS, the rotation detection unit GS, the internal power supply BT, the controller C, and the data transmission unit DT may be less than a height of the detection body SB and thus may be positioned inside the detection body SB and may not protrude outside the detection body SB.

Referring to FIGS. 5, 6, and 7, in an embodiment the detection body SB may have a relatively thin rectangular parallelepiped shape. For example, the detection body SB may have the same shape as a body of the custom tray T. In an embodiment, referring to FIG. 8, the total height from a bottom of the custom tray T may not exceed about 10 mm. The entire weight including all of the detection body SB, the vibration detection unit VS, the rotation detection unit GS, the internal power supply BT, the controller C, the data transmission unit DT, and the data display unit DI may be the same as that of the transportation device TD in the form of the custom tray T on which the substrate is mounted. In an embodiment, the detection body SB may include the weight adjustment member to adjust the weight of the impact detection device SD in the form of the custom tray T so that it has the same weight as the transportation device TD in the form of the custom tray T.

Referring to FIGS. 5, 6, and 7, the vibration detection unit VS may be coupled to the detection body SB. The vibration detection unit VS may detect the vibration of the detection body SB. In an embodiment, the vibration detection unit VS may be provided as two vibration detection units VS. In an embodiment, the two vibration detection units VS may be spaced apart from each other in a lengthwise direction of the detection body SB (e.g., the third direction D3). However, embodiments of the present disclosure are not necessarily limited thereto and the number of the vibration detection units VS and the arrangement thereof may vary. Hereinafter, for convenience, the vibration detection unit VS will be described in a singular form. The vibration detection unit VS may include the three-axis accelerometer. The three-axis accelerometer may measure the impact acceleration in the horizontal direction. The three-axis accelerometer may measure the impact acceleration in the vertical direction. In an embodiment, the three-axis accelerometer may have a horizontal impact acceleration detection range of about 2 g or more. The three-axis accelerometer may have a vertical impact acceleration detection range of about 2 g or more. The vibration detection unit VS may transmit data to the controller C.

Referring to FIGS. 5, 6, and 7, the controller C may be coupled to the detection body SB. The controller C may process the signals of the vibration detection unit VS and the rotation detection unit GS. For example, the controller C may process the impact acceleration value measured by the vibration detection unit VS. The controller C may process the rotating angular velocity measured by the rotation detection unit GS. The controller C may be disposed separately from the internal power supply BT. The controller C may transmit, to the data transmission unit DT, the impact acceleration of the vibration detection unit VS and the rotating angular velocity of the rotation detection unit GS. The controller C may set the threshold impact acceleration and the threshold rotating angular velocity.

Referring to FIGS. 5, 6, and 7, the data display unit DI may be coupled to the detection body SB. The data display unit DI may receive the power from the internal power supply BT. The data display unit DI may display the information provided from the data transmission unit DT. The data display unit DI may include the buzzer B.

Figure 9:
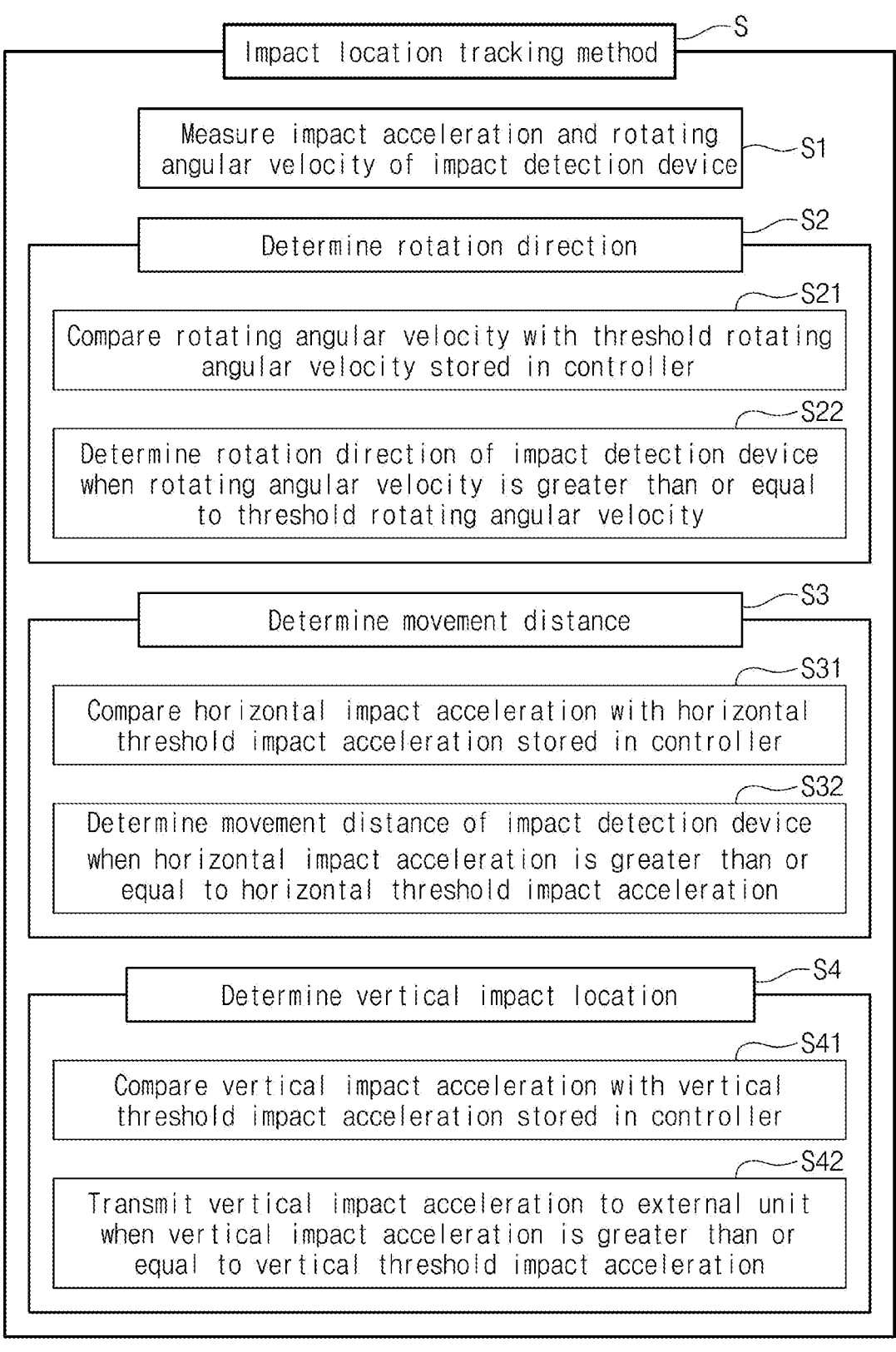
FIG. 9 is a flowchart illustrating an impact location tracking method according to an embodiment of the present disclosure.

FIG. 9 is a flowchart illustrating an impact location tracking method according to an embodiment of the present disclosure.

In a semiconductor post-process, the transportation device TD may receive an impact in various direction and manners while moving. For example, in an embodiment when moving in the horizontal direction, the transportation device TD may receive an impact in a direction opposite to the movement direction by a stopper 1 (see FIG. 11). In an embodiment, when moving in the horizontal direction, the transportation device TD may receive an impact in a direction opposite to the movement direction due to a vertical step of the distribution line CL. When moving in the vertical direction, the transportation device TD may receive an impact in a direction opposite to the movement direction. The impact method and form of the transportation device TD are not necessarily limited thereto. In this case, substrates loaded on the transportation device TD may be separated from the transportation device TD due to an impact acceleration occurring in the transportation device TD. For example, the substrates loaded on the transportation device TD may be separated from the transportation device TD due to a centrifugal force occurring when the transportation device TD rotates. The substrates loaded on the transportation device TD may be separated from the transportation device TD due to an impact in a direction opposite to the rotation direction, which occurs when the transportation device TD rotates. The impact detection device SD may move on the same movement path as that of the transportation device TD. A relative position between the impact detection device SD and the transportation device TD may be changed.

Referring to FIG. 9, a section in which the substrate is likely to be separated from the transportation device TD in the semiconductor post-process transportation system ST may be tracked and predicted using the impact detection device SD. An impact location can be tracked by the impact detection device SD. For example, in an embodiment the impact acceleration can be measured by the vibration detection unit VS of the impact detection device SD. The rotating angular velocity can be measured by the rotation detection unit GS of the impact detection device SD. The rotating angular velocity may be compared with the threshold rotating angular velocity stored in the controller C. When the rotating angular velocity is greater than or equal to the threshold rotating angular velocity, the rotation direction of the impact detection device SD may be determined. A horizontal impact acceleration may be compared with a horizontal threshold impact acceleration stored in the controller C. When the horizontal impact acceleration is greater than or equal to the horizontal threshold impact acceleration, a movement distance of the impact detection device SD may be determined. A vertical impact acceleration may be compared with a vertical threshold impact acceleration stored in the controller C. When the vertical impact acceleration is greater than or equal to the vertical threshold impact acceleration, the vertical impact acceleration may be transmitted to an external unit.

Figure 10:
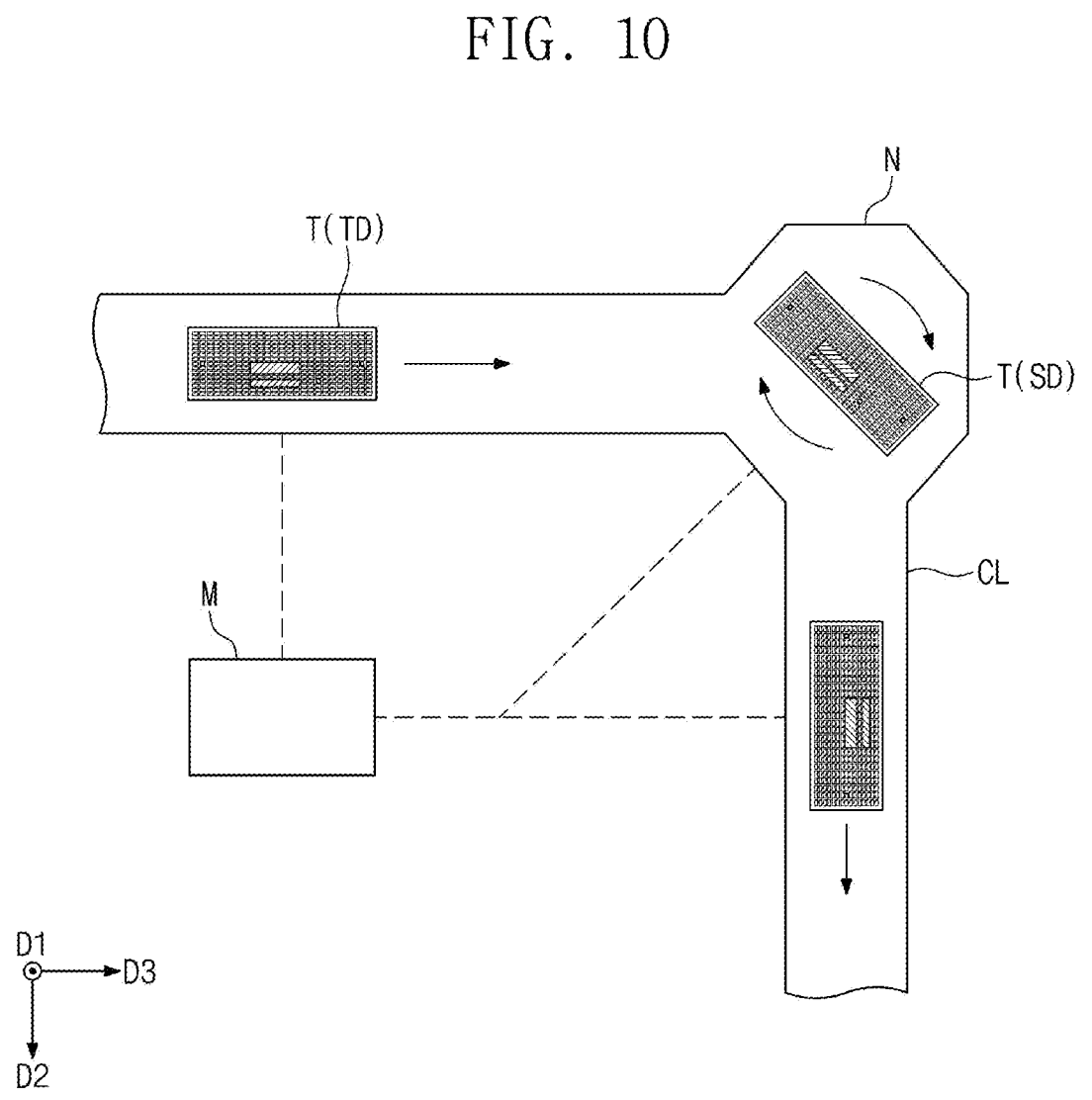

FIG. 10 is a plan view illustrating the distribution line CL, the node N, and the custom tray T according to an embodiment of the present disclosure.

Referring to FIGS. 5, 9 and 10, the rotation detection unit GS may measure the rotating angular velocity. The impact detection device SD may be in the form of a custom tray T. However, the form of the impact detection device SD is not necessarily limited to the custom tray T. The distribution line CL may be a conveyor line. However, embodiments of the present disclosure are not necessarily limited thereto. The impact detection device SD may be rotated by the node N. In an embodiment, the impact detection device SD may measure the rotating angular velocity by the rotation detection unit GS. The controller C may compare the rotating angular velocity of the impact detection device SD with the threshold rotating angular velocity set by the controller C. When the rotating angular velocity of the impact detection device SD is greater than or equal to the threshold rotating angular velocity, the rotation direction of the impact detection device SD may be determined. For example, direction change information of the node N of the distribution map M may be measured. The direction change information of the node N and the rotating angular velocity of the impact detection device SD may be matched. The rotating angular velocity of the impact detection device SD may be transmitted to an external unit. When the rotating angular velocity is greater than or equal to the threshold rotating angular velocity set by the controller C, the buzzer B may output a notification sound.

Unlike the illustration of FIG. 10, the impact detection device SD may have the form of the semiconductor package transportation magazine MZ. The distribution line CL may be a conveyor line. The distribution line CL may be the OHT. However, embodiments of the present disclosure are not necessarily limited thereto. In this case, the rotating angular velocity may be displayed on the display panel P.

Figure 11:
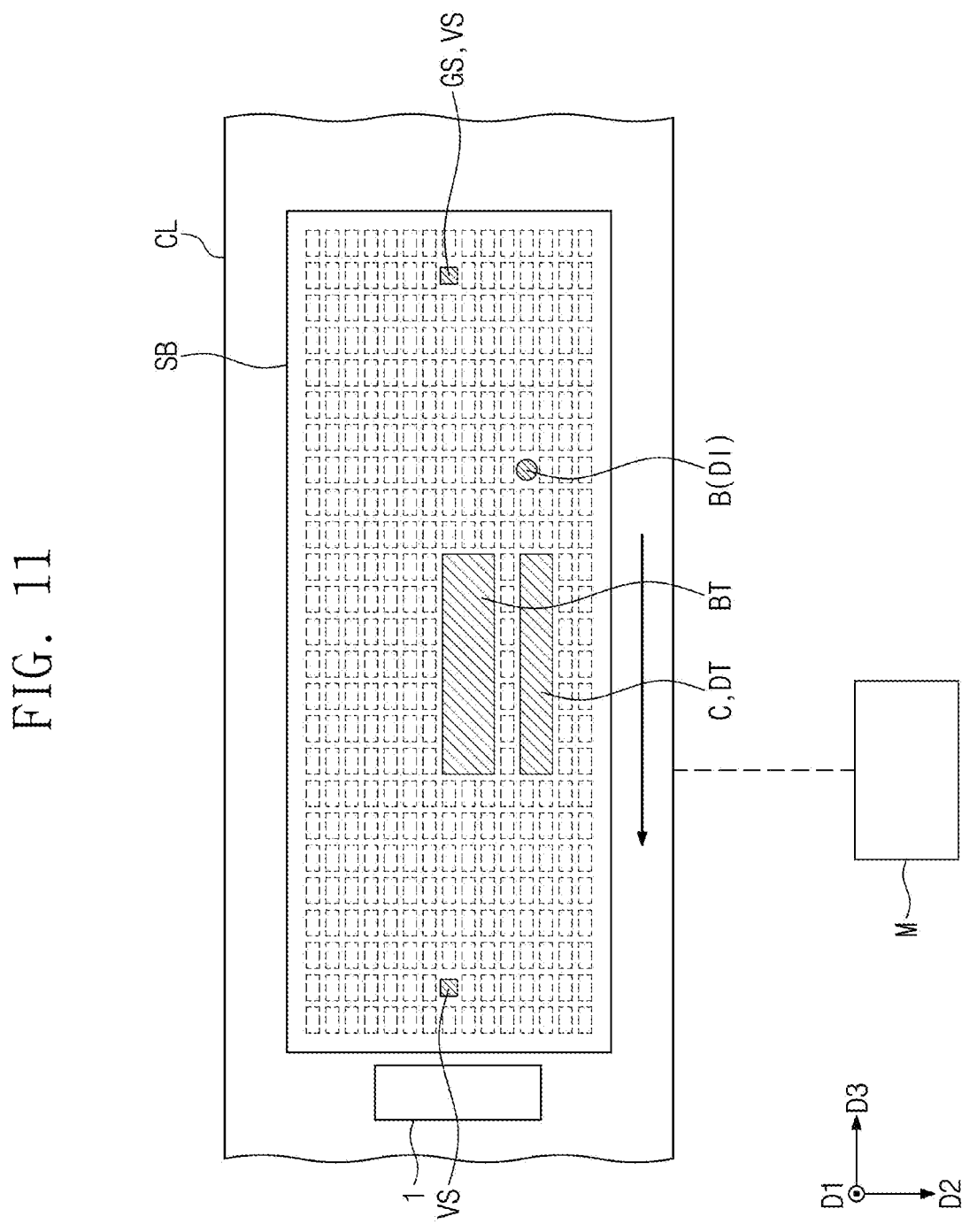
Figure 12:
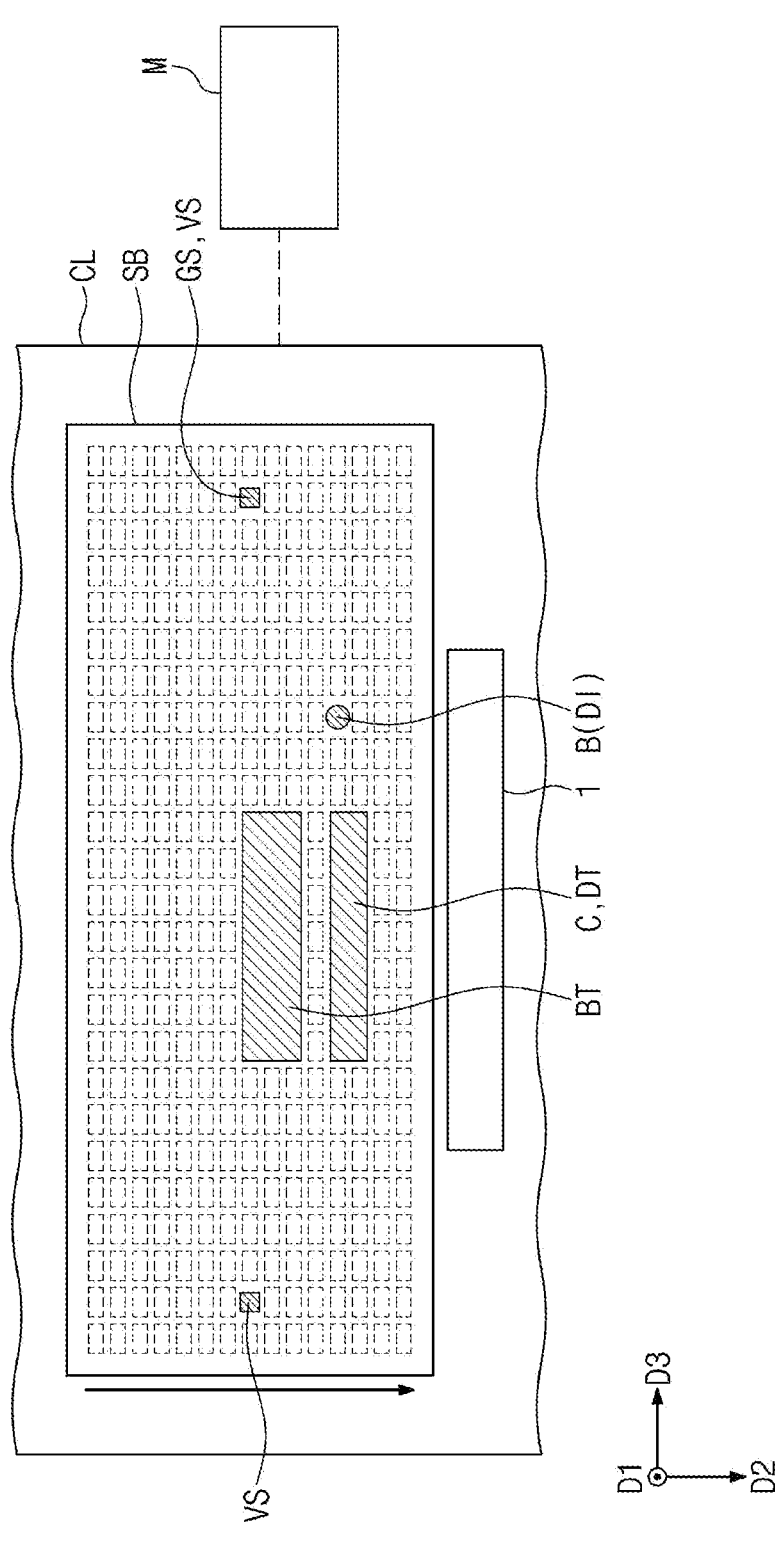
FIG. 12 is a plan view illustrating the distribution line and the custom tray according to an embodiment of the present disclosure.

FIGS. 11 and 12 are plan views illustrating the distribution line CL and the custom tray T according to embodiments of the present disclosure.

Referring to FIGS. 5, 9, 11, and 12, the impact detection device SD may have the form of the custom tray T. However, embodiments of the present disclosure are not necessarily limited thereto. The distribution line CL may be a conveyor line. However, embodiments of the present disclosure are not necessarily limited thereto. The impact detection device SD may receive an impact in the horizontal direction by the stopper 1. The vibration detection unit VS of the impact detection device SD may measure the horizontal acceleration. The controller C may compare the horizontal impact acceleration with the horizontal threshold impact acceleration set by the controller C. When the horizontal impact acceleration of the impact detection device SD is greater than or equal to the horizontal threshold impact acceleration, the movement distance of the impact detection device SD may be determined. For example, in an embodiment a movement time of the impact detection device SD may be measured. The movement distance of the impact detection device SD may be determined by the movement time and the horizontal impact acceleration of the impact detection device SD. A movement distance of the distribution line CL of the distribution map M may be measured. The movement distance of the distribution line CL and the movement distance of the impact detection device SD may be matched. The movement distance of the impact detection device SD may be transmitted to an external unit. When the horizontal impact acceleration is greater than or equal to the horizontal threshold impact acceleration set by the controller C, the buzzer B may output a notification sound.

Unlike the illustration of FIGS. 11 and 12, the impact detection device SD may have the form of the semiconductor package transportation magazine MZ. The distribution line CL may be a conveyor line. The distribution line CL may be the OHT. However, embodiments of the present disclosure are not necessarily limited thereto. In an embodiment, the horizontal impact acceleration may be displayed on the display panel P.

Figure 13:
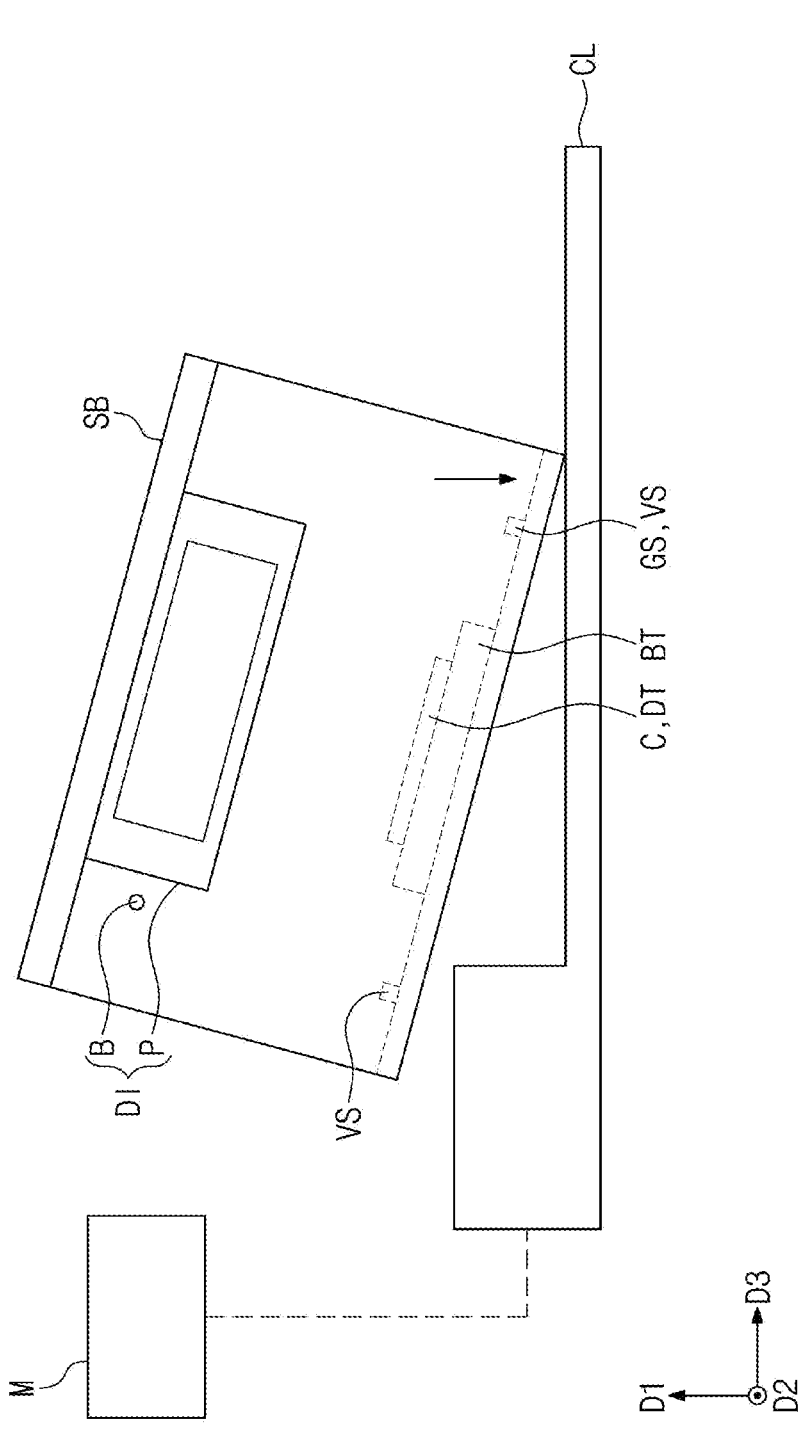
FIG. 13 is a plan view illustrating a conveyor line, a node, and the custom tray according to an embodiment of the present disclosure.

FIG. 13 is a front view illustrating the distribution line CL and the semiconductor package transportation magazine MZ according to an embodiment of the present disclosure.

Referring to FIGS. 9 and 13, the distribution line CL may be a conveyor line. The distribution line CL may be the OHT. However, embodiments of the present disclosure are not necessarily limited thereto. The impact detection device SD may fall down due to a step of the distribution line CL. The impact detection device SD may float up (e.g., rise in elevation) due to a step of the distribution line CL. The vibration detection unit VS of the impact detection device SD may measure the vertical impact acceleration. The controller C may compare the vertical impact acceleration with the vertical threshold impact acceleration stored in the controller C. When the vertical impact acceleration is greater than or equal to the vertical threshold impact acceleration, the vertical impact acceleration may be transmitted to an external unit. When the vertical impact acceleration is greater than or equal to the vertical threshold impact acceleration stored in the controller C, the buzzer B may output a notification sound. The vertical impact acceleration may be displayed on the display panel P.

According to a semiconductor post-process impact detection device, a semiconductor post-process transportation system including the same, and an impact location tracking method using the same according to an embodiment of the present disclosure, an impact acceleration of the semiconductor post-process impact detection device may be measured.

According to a semiconductor post-process impact detection device, a semiconductor post-process transportation system including the same, and an impact location tracking method using the same according to an embodiment of the present disclosure, a rotating angular velocity of the semiconductor post-process impact detection device may be measured.

According to a semiconductor post-process impact detection device, a semiconductor post-process transportation system including the same, and an impact location tracking method using the same according to an embodiment of the present disclosure, when the impact acceleration or the rotating angular velocity of the semiconductor post-process impact detection device is greater than or equal to a threshold impact acceleration or a threshold rotating angular velocity, this state may be displayed to an external unit.

According to a semiconductor post-process impact detection device, a semiconductor post-process transportation system including the same, and an impact location tracking method using the same according to an embodiment of the present disclosure, a location of the semiconductor post-process impact detection device may be tracked.

According to a semiconductor post-process impact detection device, a semiconductor post-process transportation system including the same, and an impact location tracking method using the same according to an embodiment of the present disclosure, a distribution line section having a high distribution deviation probability may be tracked.

The effects of embodiments of the present disclosure are not limited to the effects described above, and those skilled in the art will clearly understand other effects not described from the following description.

Hereinabove, non-limiting embodiments of the present disclosure have been described with reference to the accompanying drawings. However, those skilled in the art to which the present disclosure pertains can understand that the present disclosure can be implemented in other specific forms without changing the technical spirit or essential features thereof. Therefore, it should be understood that the described embodiments are illustrative but not limiting in all aspects.

What is claimed is:

1. A semiconductor post-process impact detection device comprising:
   a detection body that moves along a distribution line;
   a vibration detection unit coupled to the detection body, the vibration detection unit detects vibration of the detection body;
   a rotation detection unit coupled to the detection body, the rotation detection unit detecting rotation of the detection body;
   an internal power supply coupled to the detection body;
   a controller processing signals of the vibration detection unit and the rotation detection unit to determine information concerning the detection body, the controller transmitting the information concerning the detection body to a data transmission unit;
   the data transmission unit transmitting the information concerning the detection body provided from the controller to a data display unit; and
   the data display unit displaying the information concerning the detection body provided from the data transmission unit,
   wherein the controller is configured to determine the information concerning the detection body based on a distribution map of the distribution line,
   wherein the distribution line includes a predetermined movement direction, a vertical step, and a rotation node configured to transport the detection body and a transportation device,
   wherein the transportation device includes a transportation body supporting a substrate,
   wherein the transportation body and the detection body have a same shape as each other, and
   wherein a weight of the transportation device including the substrate and a weight of the semiconductor post-process impact detection device are equal to each other.

2. The semiconductor post-process impact detection device of claim 1, wherein:
   the vibration detection unit is provided as two vibration detection units; and
   the two vibration detection units are spaced apart from each other in a lengthwise direction of the detection body.

3. The semiconductor post-process impact detection device of claim 1, wherein:
   the vibration detection unit detects an impact acceleration of the detection body and the rotation detection unit detects a rotating angular velocity of the detection body;
   the data display unit further includes a buzzer; and
   the buzzer outputs a notification sound when the impact acceleration detected by the vibration detection unit is greater than or equal to a threshold impact acceleration or the rotating angular velocity detected by the rotation detection unit is greater than or equal to a threshold rotating angular velocity.

4. The semiconductor post-process impact detection device of claim 1, wherein the vibration detection unit includes a three-axis accelerometer.

5. The semiconductor post-process impact detection device of claim 1, wherein the rotation detection unit includes a gyro sensor.

6. The semiconductor post-process impact detection device of claim 4, wherein the detection body is in a form of a semiconductor package transportation magazine.

7. The semiconductor post-process impact detection device of claim 6, wherein the data display unit includes a display panel.

8. The semiconductor post-process impact detection device of claim 6, wherein:
  the vibration detection unit detects an impact acceleration of the detection body; and
  an impact acceleration detection range of the three-axis accelerometer in all directions is about 2 g or more.

9. The semiconductor post-process impact detection device of claim 4, wherein the detection body is in a form of a custom tray.

10. The semiconductor post-process impact detection device of claim 9, wherein an impact acceleration detection range of the three-axis accelerometer in all directions is greater than or equal to about 2 g.

11. The semiconductor post-process impact detection device of claim 9, wherein a height from a bottom of the detection body to an uppermost end of the semiconductor post-process impact detection device is less than or equal to about 10 mm.

12. The semiconductor post-process impact detection device of claim 1, further comprising:
  a weight adjustment member coupled to the detection body to adjust a weight of the semiconductor post-process impact detection device.

13. A semiconductor post-process transportation system comprising:
  a distribution line;
  a transportation device moving along the distribution line and transporting a substrate; and
  an impact detection device moving along the distribution line,
  wherein the impact detection device includes:
  a detection body that moves along the distribution line;
  a vibration detection unit coupled to the detection body, the vibration detection unit detects vibration of the detection body;
  a rotation detection unit coupled to the detection body, the rotation detection unit detecting rotation of the detection body;
  an internal power supply coupled to the detection body; and
  a controller processing signals of the vibration detection unit and the rotation detection unit,
  wherein the controller is configured to determine information concerning the detection body based on a distribution map of the distribution line,
  wherein the distribution line includes a predetermined movement direction, a vertical step, and a rotation node configured to transport the detection body and a transportation device,
  wherein the transportation device includes a transportation body supporting the substrate,
  wherein the transportation body and the detection body have a same shape as each other, and wherein a weight of the transportation device and a weight of the impact detection device are equal to each other.

14. The semiconductor post-process transportation system of claim 13, wherein the impact detection device includes:
  a data transmission unit transmitting the information concerning the detection body provided from the controller to a data display unit; and
  the data display unit displays the information provided from the data transmission unit.

15. The semiconductor post-process transportation system of claim 14, wherein the data display unit includes a buzzer.

16. An impact location tracking method comprising:
  measuring a rotating angular velocity by a rotation detection unit of an impact detection device on a semiconductor post-process distribution line; and
  determining a rotation direction when the rotating angular velocity is greater than or equal to a threshold rotating angular velocity stored in a controller of the impact detection device,
  wherein the impact detection device includes:
  a detection body;
  the rotation detection unit coupled to the detection body, the rotation detection unit detects rotation of the detection body;
  an internal power supply coupled to the detection body;
  the controller processes a signal of the rotation detection unit to determine information concerning the detection body, the controller transmitting the information concerning the detection body to a data transmission unit; and
  the data transmission unit transmitting the information concerning the detection body provided from the controller to a data display unit; and
  the determining of the rotation direction of the impact detection device includes:
  measuring a direction change information of a node of a distribution map; and
  matching the direction change information of the node and the rotating angular velocity of the impact detection device with each other,
  wherein the semiconductor post-process distribution line includes a predetermined movement direction, a vertical step, and a rotation node configured to transport the detection body and a transportation device configured to transport a substrate,
  wherein the transportation device includes a transportation body supporting the substrate,
  wherein the transportation body and the detection body have a same shape as each other, and
  wherein a weight of the transportation device and a weight of the impact detection device are equal to each other.

17. The impact location tracking method of claim 16, wherein the impact detection device includes a vibration detection unit coupled to the detection body, the vibration detection unit detecting vibration of the detection body,
  the controller processes a signal of the vibration detection unit,
  the impact location tracking method includes:
  measuring a horizontal impact acceleration by the vibration detection unit; and
  determining a movement distance of the impact detection device when the horizontal impact acceleration is greater than or equal to a threshold impact acceleration stored in the controller, and the determining of the movement distance includes:

measuring a movement time of the impact detection device;

measuring the movement distance of the impact detection device using the movement time and the horizontal impact acceleration;

measuring a movement distance of the semiconductor post-process distribution line of the distribution map; and matching the movement distance of the semiconductor post-process distribution line and the movement distance of the impact detection device.

18. The impact location tracking method of claim 17, further comprising:

measuring a vertical impact acceleration by the vibration detection unit; and transmitting data to the distribution map when the vertical impact acceleration is greater than or equal to a threshold impact acceleration stored in the controller.

* * * * *